(12) United States Patent
Sakai et al.

(10) Patent No.: US 8,222,569 B2
(45) Date of Patent: Jul. 17, 2012

(54) HEAT-TREATING APPARATUS, HEAT-TREATING METHOD AND STORAGE MEDIUM

(75) Inventors: Yuichi Sakai, Koshi (JP); Kiyomitsu Yamaguchi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 937 days.

(21) Appl. No.: 12/244,885

(22) Filed: Oct. 3, 2008

(65) Prior Publication Data

US 2009/0098297 A1    Apr. 16, 2009

(30) Foreign Application Priority Data

Oct. 12, 2007  (JP) ................... 2007-266541
Aug. 19, 2008  (JP) ................... 2008-210967

(51) Int. Cl.
*F27B 5/16* (2006.01)
*H01L 21/02* (2006.01)
*H01L 21/324* (2006.01)
*B05C 11/06* (2006.01)

(52) U.S. Cl. ........ 219/390; 219/399; 118/724; 118/728; 165/61

(58) Field of Classification Search .................. None
See application file for complete search history.

(56) References Cited

U.S. PATENT DOCUMENTS

| | | | | |
|---|---|---|---|---|
| 5,885,353 A | * | 3/1999 | Strodtbeck et al. | 118/728 |
| 5,937,541 A | * | 8/1999 | Weigand et al. | 34/565 |
| 6,474,986 B2 | * | 11/2002 | Oda et al. | 118/724 |
| 6,534,750 B1 | * | 3/2003 | Tanoue et al. | 118/224 |
| 6,869,485 B2 | * | 3/2005 | Halpin | 118/725 |
| 7,842,905 B2 | * | 11/2010 | Saule et al. | 118/724 |
| 2008/0217319 A1 | * | 9/2008 | Saule et al. | 219/443.1 |

FOREIGN PATENT DOCUMENTS

| | | |
|---|---|---|
| JP | 10-284382 | 10/1998 |
| JP | 2001-52985 | 2/2001 |
| JP | 2002-50573 | 2/2002 |
| JP | 2008166658 A * | 7/2008 |

OTHER PUBLICATIONS

JP2008-166658a, Oshima et al, Jul. 2008, partial translation.*

* cited by examiner

*Primary Examiner* — Joseph M Pelham
(74) *Attorney, Agent, or Firm* — Oblon, Spivak, McClelland, Maier & Neustadt, L.L.P.

(57) ABSTRACT

A heat treating apparatus utilizes a straightening plate provided in its central part with a gas exhaust opening and disposed under a heating plate. A temperature-reducing purge ring is disposed between the face plate and the straightening plate, and is provided in its inner circumference with plural gas jetting holes. A thin gap is formed between the temperature-reducing purge ring and the face plate. When a cooling gas is jetted radially inward through the gas jetting holes, a vacuum is created between the lower surface of the face plate and the upper surface of the temperature-reducing purge ring. Air is sucked into the space between the face plate and the straightening plate and flows together with the cooling gas to rapidly cool the face plate.

9 Claims, 15 Drawing Sheets

HEAT-TREATING APPARATUS, HEAT-TREATING METHOD AND STORAGE MEDIUM

BACKGROUND OF THE INVENTION

1. Field of the Invention

The present invention relates to a heat-treating apparatus for processing a substrate placed on a hot plate by a heating process, a heat-treating method, and a storage medium storing a program including instructions for carrying out the heat-treating method.

2. Description of the Related Art

A heat-treating apparatus is incorporated into a coating and developing system for processing a substrate by wet processes, such as a coating process for coating a substrate with a resist film and a developing process for processing a substrate coated with a resist film. The heat-treating apparatus processes substrates respectively coated with resist films of different kinds. Therefore, heat-treating conditions including a proper heating temperature and a proper heating time are selectively determined in compliance with the kinds of resist films.

For example, when a heating temperature to be used by the heat-treating apparatus for the succeeding lot of substrates is different from that used by the heat-treating apparatus for the preceding lot of substrates, the heat-treating apparatus is set for the heating temperature for the succeeding lot of substrates. For example, when the heating temperature for the succeeding lot of substrates is higher than that for the preceding lot of substrates, the output of a heater incorporated into a heating plate is increased. When the heating temperature for the succeeding lot of substrates is lower than that for the preceding lot of substrates, the heating plate is cooled.

Cooling methods of cooling the heating plate mentioned in, for example, JP-A H10-284382 (Paragraph [0012], FIG. 1) and JP-A 2001-52985 (Paragraphs (0013) and [0031]) bring the lower surface of the heating plate into contact with a flowing coolant, such as a flowing liquid, to cool the heating plate through heat exchange between the heating plate and the coolant. When the heating plate is cooled by those cooling methods, a passage is defined for the coolant to circulate the coolant through a space contiguous with the back surfaces of the heating plate and a cooling mechanism for cooling the coolant to avoid contaminating the surface of the heating plate with the coolant.

The heating plate is made of a high-strength material, such as aluminum nitride (AlN) and has a small thickness on the order of, for example, 3 mm. While on the one hand such a material has high strength, the material is expensive and requires a high machining cost. Efforts have been made in recent years to use an inexpensive metal not requiring high machining cost, such as aluminum (Al), instead of the foregoing expensive material. Aluminum, as compared with aluminum nitride, has a low strength and hence the heating plate of aluminum needs to be formed in a big thickness that will not allow the heating plate to warp to provide the heating plate with a necessary strength. Increase in the thickness of the heating plate increases the heat capacity of the heating plate. When lots are changed, the heating plate having a large heat capacity takes a long time for cooling, which reduces throughput.

The thick heating plate may be cooled in a short cooling time by increasing the flow of the coolant for cooling the heating plate. However, the coating and developing system is designed such that cooling can be achieved by circulating the coolant at the lowest possible flow rate. Therefore, a small cooling device, such as a small compressor for compressing a cooling gas, a small booster pump for supplying cooling water or a small chiller, having a capacity sufficient to supply the coolant at a necessary flow rate is employed. If the flow rate of the coolant needs to be increased, the design of the coating and developing system need to be changed to employ a large cooling device. Thus, it has been very difficult to reduce the cooling time.

On the other hand, it is desired to reduce the flow of the coolant supplied by the cooling device without increasing the cooling time necessary for cooling the heating plate to reduce electric energy necessary for supplying the coolant or to reduce the size of the cooling device.

As mentioned above, the heat treatment of the succeeding lot of substrates is started immediately after cooling the heating plate and hence the surface of the heating plate needs to be cooled uniformly. For example, nozzles for spouting a coolant on the cooling plate needs to be placed at many positions relative to the heating plate and many supply lines need to be connected to the nozzles to cool the heating plate uniformly. Consequently, the component parts, the size and the cost of the heat-treating apparatus increase.

SUMMARY OF THE INVENTION

The present invention has been made in view of such problems and it is therefore an object of the present invention to provide techniques for rapidly cooling a heating plate for heating a substrate placed thereon by supplying a cooling gas at a low flow rate, for example, when change of lots requires cooling the heating plate.

A heat-treating apparatus for heat-treating a substrate according to the present invention includes: a heating plate capable of supporting a substrate thereon and provided with heating means; cooling gas jetting means provided with plural gas jetting holes arranged along the circumference of the heating plate to jet a cooling gas for cooling the heating plate so that the cooling gas flows from the circumference toward the center of the lower surface of the heating plate; a straightening plate disposed opposite to the heating plate under the heating plate close to the heating plate to straighten the flow of the cooling gas under the heating plate, and provided with an exhaust opening in a central part thereof; and a member surrounding the gas jetting member and the straightening plate so as to define an air suction space through which the external atmosphere is sucked into a space between the heating plate and the straightening plate by the vacuum created by the flow of the cooling gas.

In the heat-treating apparatus, it is preferable that the cooling gas jetting means is an annular pipe provided with the cooling gas jetting holes in a inner circumference thereof, formed in a ring and disposed under the circumference of the heating plate, and a cooling gas supply line is connected to the annular pipe.

Preferably, the annular pipe is separated from the lower surface of the heating plate by a space connecting to the air suction space.

In the heat-treating apparatus, it is preferable that the cooling gas jetting means includes plural cooling nozzles disposed with their tips arranged at angular intervals along the circumference of the heating plate under the heating plate, and the gas jetting holes are formed in the tips of the cooling nozzles.

Preferably, the cooling nozzles penetrate the straightening plate from the lower surface toward the upper surface of the straightening plate.

Preferably, a space between the heating plate and the straightening plate has a thickness of 15 mm or below, desirably, 8 mm or below.

Preferably, the axes of the gas jetting holes extend obliquely upward such that the cooling gas jetted through the gas jetting holes impinges on the lower surface of the heating plate.

A heat-treating method according to the present invention includes the steps of: heating a substrate placed on a heating plate; creating a vacuum in a space under a peripheral part of the lower surface of the heating plate by jetting a cooling gas for cooling the heating plate through plural gas jetting holes arranged along the circumference of the heating plate so that the cooling gas flows from a circumferential part toward a central part of the heating plate under the heating plate; cooling the heating plate by the cooling gas and air sucked through an air suction space around the heating plate by the vacuum created by the flow of the cooling gas into a space between the heating plate and a straightening plate disposed under the heating plate; and discharging the cooling gas and the air sucked from the external space into the space between the heating plate and the straightening plate downward through a gas exhaust opening formed in a central part of the straightening plate.

Preferably, the cooling gas is jetted obliquely upward such that the cooling gas impinges on the lower surface of the heating plate in the step of creating a vacuum.

A storage medium according to the present invention stores a computer program including a set of instructions for a computer to execute to carry out the heat-treating method.

For example, when lots of substrates are changed and the heat-treating apparatus of the present invention for heating a substrate placed on the heating-plate needs to cool the heating plate, the cooling gas for cooling the heating plate is jetted through the plural gas jetting holes arranged along the circumference of the heating plate so that the cooling gas flows under the heating plate from a circumferential part toward a central part of lower surface of the heating plate to create a vacuum in a space around the heating plate, sucks the external air into the space under the heating plate by the vacuum to make the external air flow together with the cooling gas. Thus, the heating plate can be rapidly cooled even if the cooling gas is supplied through the gas jetting holes at a low flow rate.

DESCRIPTION OF THE PREFERRED EMBODIMENTS

A heat-treating apparatus 2 in a first embodiment according to the present invention will be described with reference to FIGS. 1 to 6 as applied to a coating and developing system for forming a film, such as a resist film, on a substrate, such as a semiconductor wafer (hereinafter, referred to as "wafer").

Figure 1:
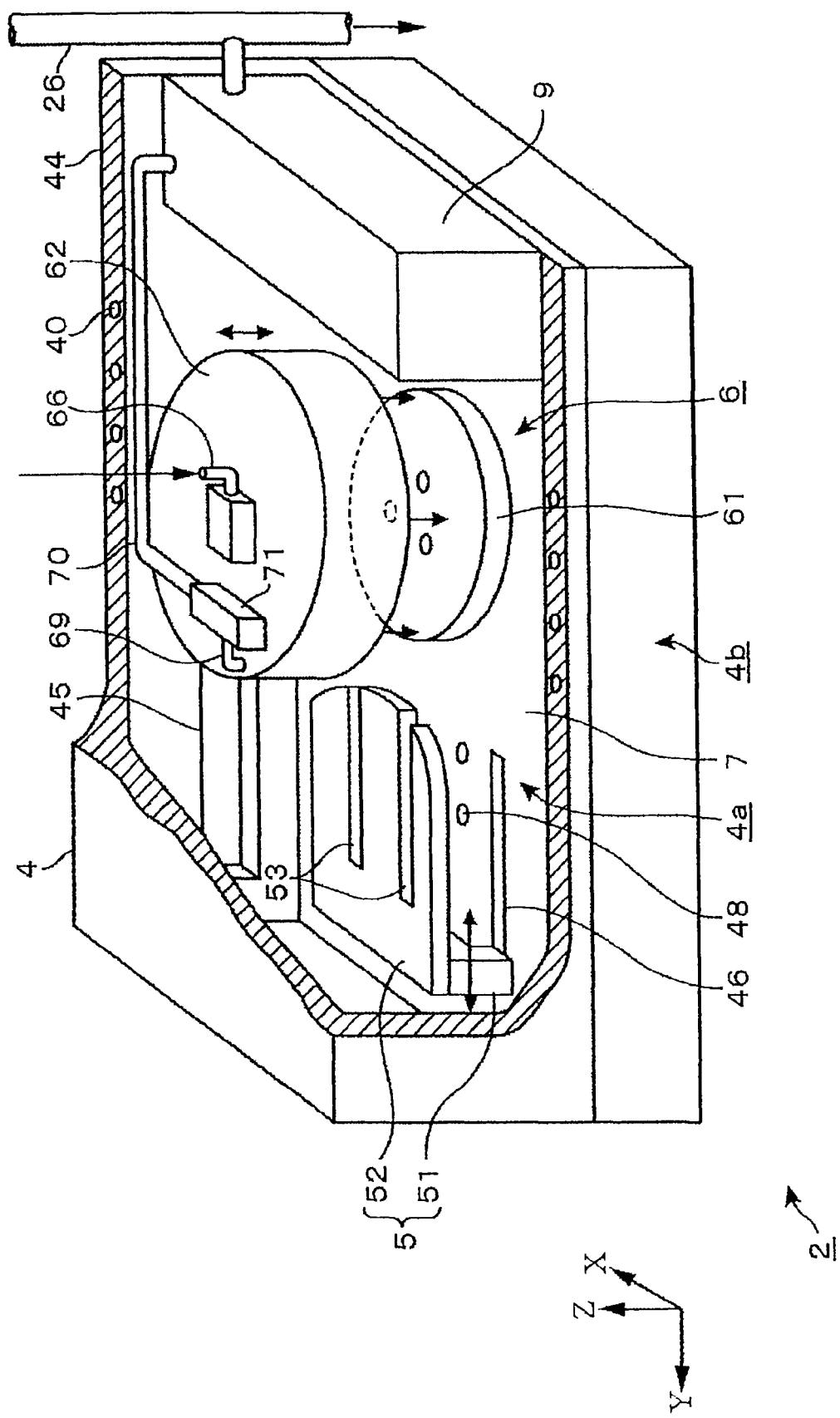
FIG. 1 is a perspective view of a heat-treating apparatus in a first embodiment according to the present invention.

The heat-treating apparatus 2 is surrounded by a box 4 of, for example, aluminum. The interior of the box 4 is divided into an upper space 4a in which a wafer W is subjected to a heat-treating process and a lower space 4b in which a driving mechanism for vertically moving a wafer W is installed by a wall 7. A left side, namely, a side on the positive side of the Y axis, in FIG. 1 is supposed to be a front side for convenience. A cooling arm 5, a heating module 6 and a housing 9 housing some of the parts of an exhaust system are arranged in that order from the front side toward the rear side. An opening 45 is formed in a front part of a side wall 44 of the box 4. A wafer W is transferred through the opening 45 between the cooling arm 5 and a main carrying device 25 which will be described later. A shutter, not shown, covers the opening 45 and opens the opening 45 when necessary. For example, four vertical coolant passages 40 are formed in each of the opposite side walls 44 respectively on the opposite sides of the heating module 6. A coolant flows vertically through the coolant passages 40. For example, cooling water cooled at a desired temperature and supplied from a storage unit, not shown, disposed in the lowermost layer of a shelf unit U, which will be described layer, flows through the coolant passages 40.

The cooling arm 5 has a support plate 52 for supporting a wafer W thereon, and a leg 51 holding the support plate 52 by the front part. The leg 51 of the cooling arm 5 is guided by a guide 46 for longitudinal sliding movement along the length of the box 41 between a position where a wafer W is transferred through the opening 45 between cooling arm 5 and the main carrying device 25 and a position where a wafer W is transferred between the cooling arm 5 and the heating module 6. A passage, not shown, through which, for example, a temperature adjusting medium, such as pure water, flows is formed in the lower surface of the support plate 52 for the rough cooling of a heated wafer W.

Figure 2:
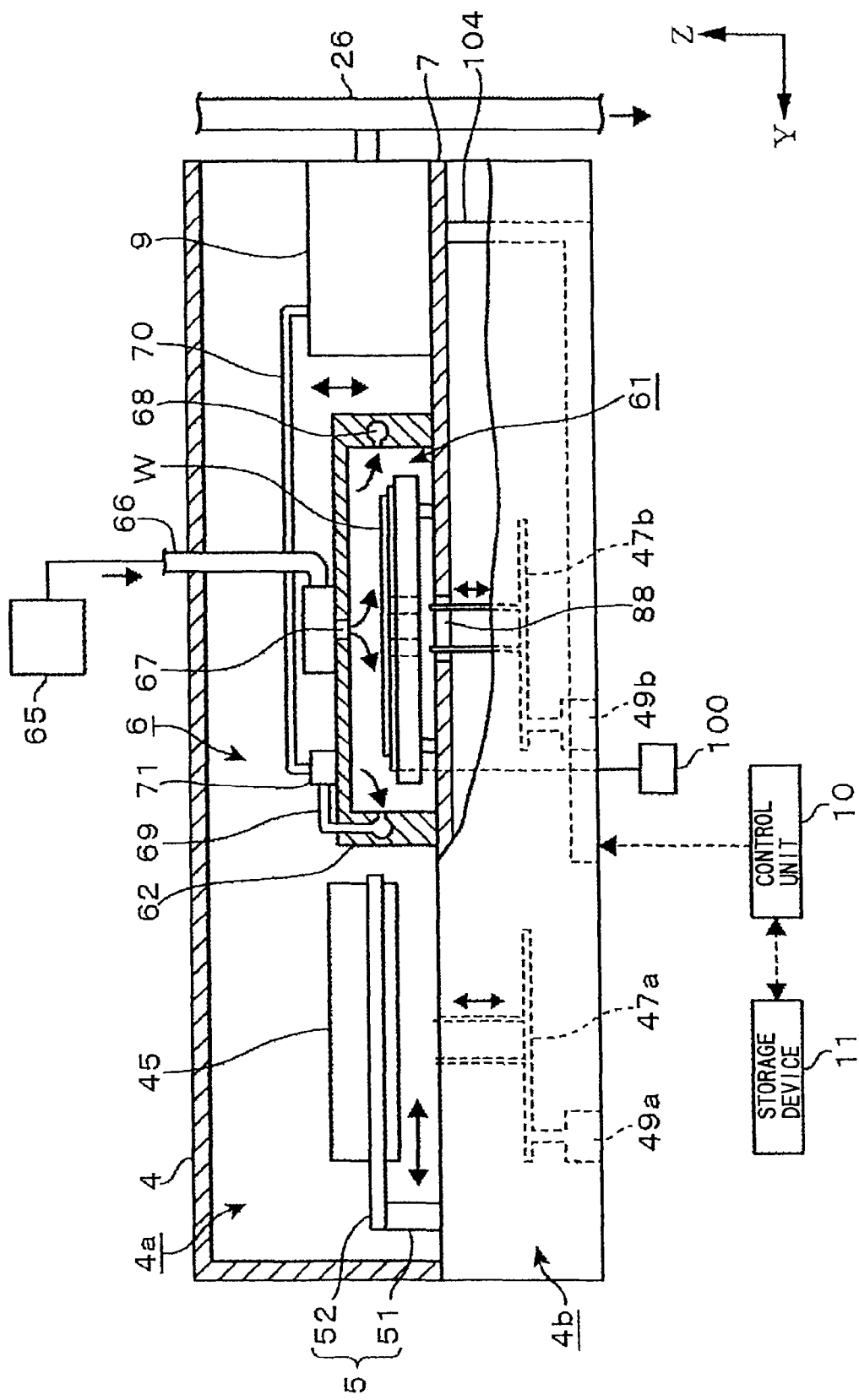
FIG. 2 is a longitudinal sectional view of the heat-treating apparatus shown in FIG. 1.

Referring to FIG. 2, lifting pins 47a connected to a lifting mechanism 49a, and lifting pins 47b connected to a lifting mechanism 49b are disposed at a transfer position near the opening 45 and a processing position, respectively, to move a wafer W supported on the cooling arm 5 vertically. The support plate 52 is provided with slits 53 through which the lifting pins 47a and 47b can move vertically. The wall 7 is provided with through holes 48 through which the lifting pins 47a can move vertically. The lifting pins 47b move vertically through a first gas exhaust opening 88 formed in the wall 7.

Figure 3:
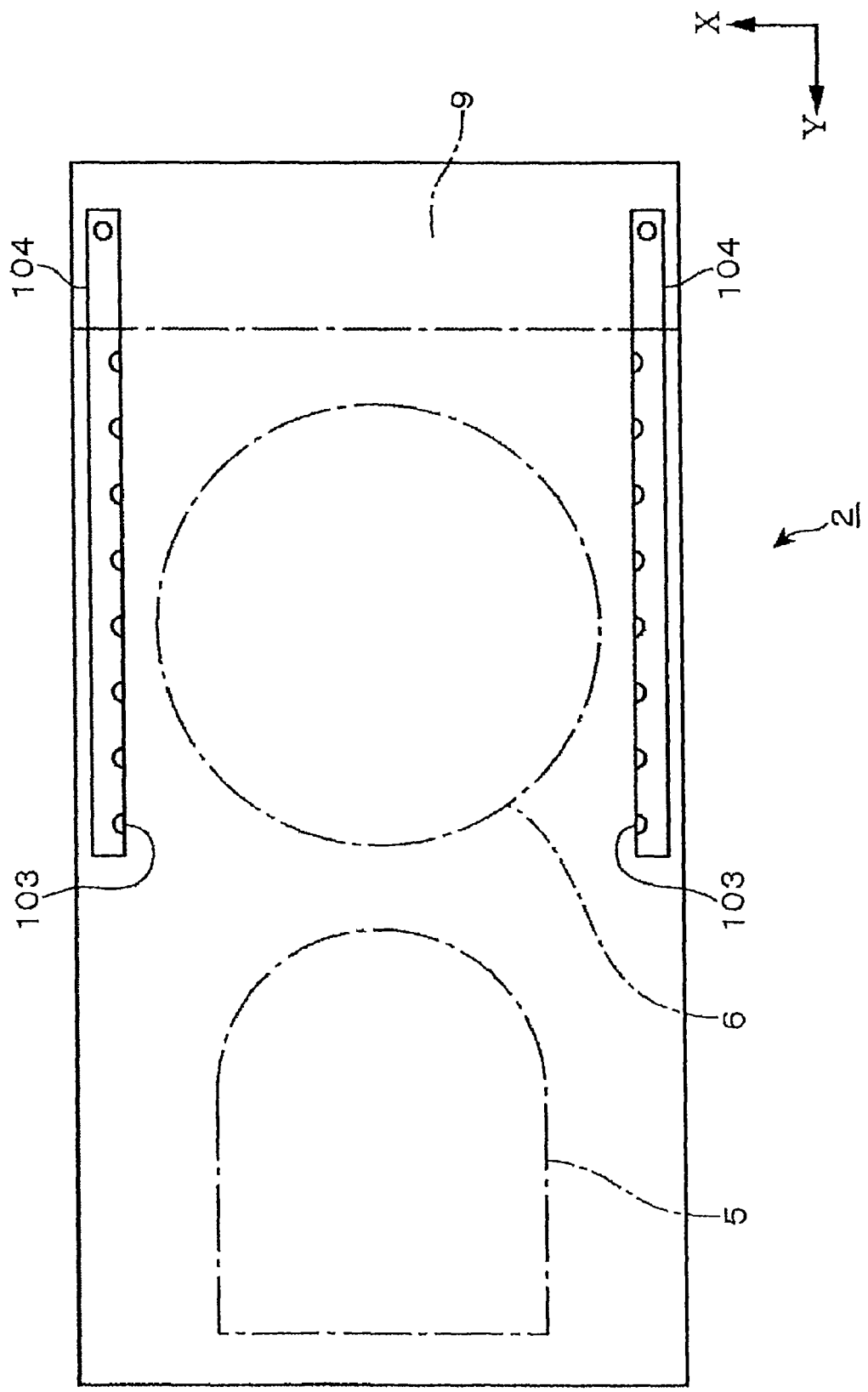
FIG. 3 is a plan view of the heat-treating apparatus shown in FIG. 1.

As shown in FIG. 3, exhaust ducts 104 extending along the length of the box 4 are disposed in the lower space 4b at positions corresponding to positions on the opposite sides of the heating module 6 near the side walls 44, respectively. The exhaust ducts 104 connect through the housing 9 to a main exhaust duct 26, for example, for the units of the shelf unit U. Opposite side walls of the exhaust ducts 104 are provided with plural suction openings 103 through which air in the lower space 4b is discharged.

The heating module 6 will be described. As shown in FIG. 1, the heating module 6 has a heating unit 61 for heating a wafer W, and a cover 62 having the shape of an inverted cup and an open lower end and covering the heating unit 61 from above. The cover 62 can be vertically moved between an upper position and a lower position by a lifting mechanism, not shown. When the cover 62 is placed at the upper position, a wafer W can be transferred between the heating unit 61 and the cooling arm 5. When the cover is placed at the lower position, the cover 62 surrounds the heating unit 61, and a sealing member, not shown, attached to the lower edge of the cover 62 come into close contact with the wall 7 to seal a space around a wafer W.

A gas supply pipe 66 has one end connected to an inlet 67 formed in a central part of the top wall of the cover 62 and the other end connected to a gas source 65. For example, air and nitrogen gas can be supplied through the inlet 67 to a wafer W placed in the heating unit 61. The side wall of the cover 62 is provided with pores 68 arranged, for example, in a circumferential part corresponding to the circumference of a wafer W covered with the cover 62. The pores 68 connect through an exhaust passage 69 formed in the side wall of the cover 62 and a collecting part 71 placed on the top wall of the cover 62 to an exhaust passage 70. Volatile substances emitted from a wafer W can be discharged together with air and nitrogen supplied by the gas source 65. The collecting part 71 is internally provided with, for example, a filter capable of collecting the volatile substances. The main exhaust duct 26 is connected through, for example, a flow regulating device, not shown, placed in the housing 9 to a downstream part of the exhaust passage 70.

Figure 4:
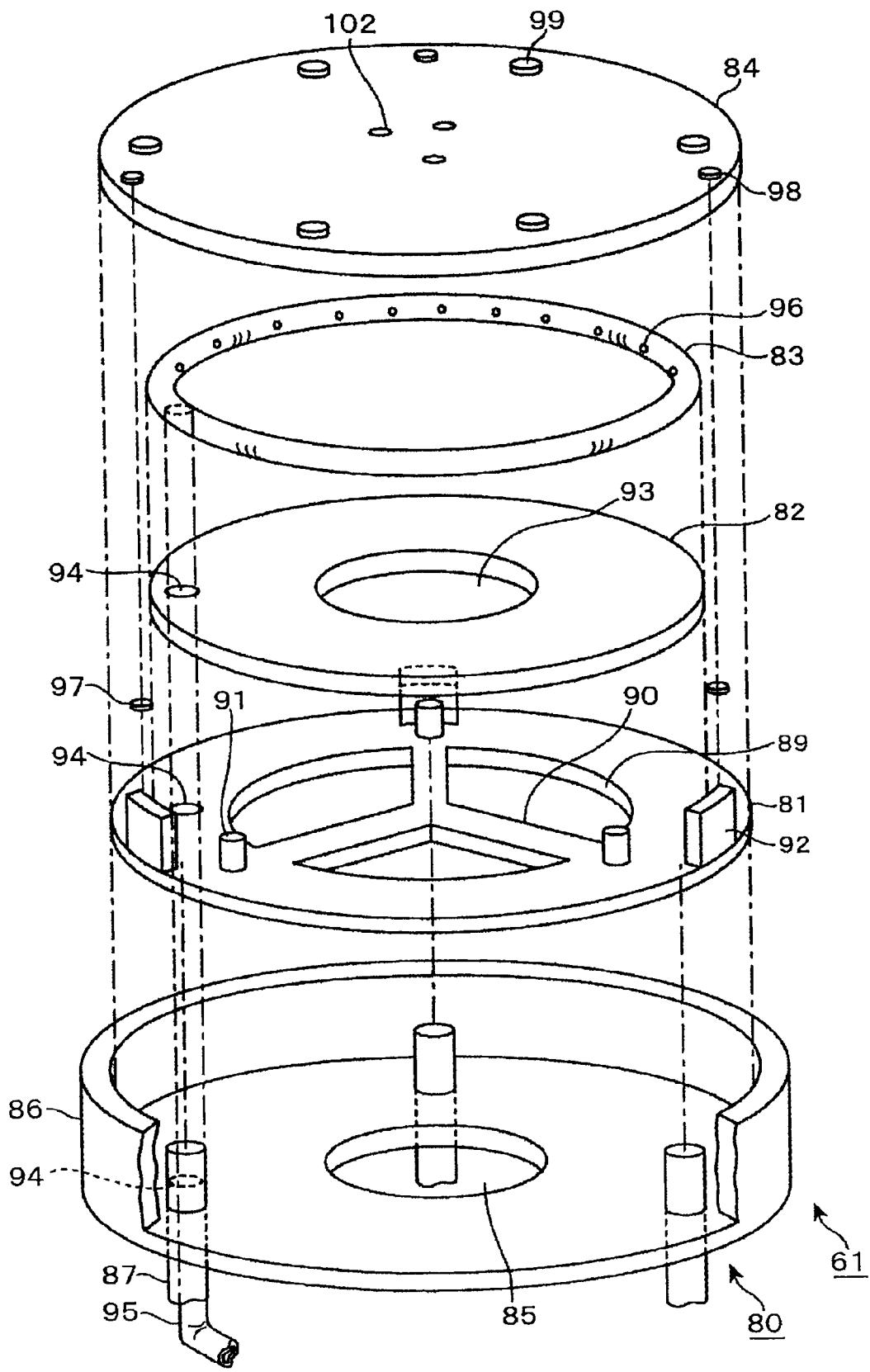
FIG. 4 is an exploded perspective view of a heating unit included in the heat-treating apparatus shown in FIG. 1.

The heating unit 61 will be described with reference to FIGS. 4 to 6. The heating unit 61 is formed by stacking a support ring 80, a bottom plate 81, a straightening plate 82, a temperature-reducing purge ring 83, namely, an annular pipe, and a face plate 84, namely, a heating plate, upward in that order. The face plate 84 is made of a comparatively inexpensive, easy-to-machine metal, such as aluminum, a stainless steel or a copper alloy.

The support ring 80 has the shape of a disk provided in its central part with a second gas exhaust opening 85 of, for example, 100 mm in diameter, and provided with an upright circumferential wall 86 of, for example, 40 mm in height. The support ring 80 has an outside diameter greater then the diameter of a wafer W by 40 mm. Support shafts 87 penetrate the bottom wall of the support ring 80 to a position corresponding to, for example, about half the height of the upright circumferential wall 86. The support ring 80 is supported on the wall 7 by the support shafts 87. As shown in FIG. 5, the wall 7 is provided in a part thereof corresponding to the second gas exhaust opening 85 with a first gas exhaust opening 88 of a diameter substantially equal to that of the second gas exhaust opening 85.

The bottom plate 81 is supported on the support shafts 87 of the support ring 80 in the support ring 80. The bottom plate 81 has a diameter smaller than the outside diameter of the support ring 80 by, for example, 14 mm. The bottom plate 81 is provided in its central part with a third gas exhaust opening 89 of a diameter of, for example, 140 mm greater than that of the second gas exhaust opening 85. The third gas exhaust opening 89 is divided into three sectorial sections of the same shape by three arms 90 extending from the center of the third gas exhaust opening 89 at equal angular intervals. Three cylindrical supports 91 of a height of, for example, 15 mm are arranged on a circle of a diameter greater than that of the third gas exhaust opening 89 on the bottom plate 81. Three hot plate supports 92 of a height of, for example, 25 mm having outer side surfaces merging into the circumference of the bottom plate 81 are stood from the outer circumferential edge of the bottom plate 81.

The straightening plate 82 is supported on the supports 91. The straightening plate 82 is provided in its central part with a fourth gas exhaust opening 93 of a diameter equal to or slightly smaller than that of the second gas exhaust opening 85.

The temperature-reducing purge ring 83 is placed on the upper surface of the straightening plate 82 coaxially with the straightening plate 82. As shown in FIGS. 5 and 6, the temperature-reducing purge ring 83 defines an annular gas passage 83a. A cooling gas supply line 95 is extended from below the support ring 80 through openings 94 formed in the support ring 80, the bottom plate 81 and the straightening plate 82. The cooling gas supply line 95 has one end connected to the temperature-reducing purge ring 83 and the other end connected to a cooling gas source 100. For example, twelve gas jetting holes 96 connecting to the annular gas passage 83a are formed in the inner circumference of the temperature-reducing purge ring 83 on the side of the fourth gas exhaust opening 93. The axes of the gas jetting holes 96 are extend obliquely upward at an angle $\theta$ to a horizontal plane. The angle $\theta$ is, for example, in the range of about 20° to about 35°. The axes of the gas jetting holes 96 may be inclined at different angles, respectively, to a horizontal plane.

The face plate 84 is supported on the hot plate supports 92 with damping members 97 held between the face plate 84 and the hot plate supports 92. The face plate 84 is fixed to the bottom plate 81 with fixing members 98, such as screws. The thickness of a gap L between the face plate 84 and the upper surface of the temperature-reducing purge ring 83 is, for example, in the range of 1.5 to 4 mm. The gap L is part of an external air inlet opening, which will be described later. The gap L may be an annular gap formed between the temperature-reducing purge ring 83 and the lower surface of a wafer W, provided that air can flow uniformly through the gap L into a cooling gas receiving space G.

The cooling gas receiving space G through which a cooling gas flows is a thin space having the shape of a disk between the lower surface of the face plate 84 and the upper surface of the straightening plate 82. The thickness of the cooling gas receiving space G is, for example, 15 mm or below, preferably, 8 mm or below.

The face plate 84 is a disk of a thickness of, for example, 10 mm on which a wafer W is supported. The face plate 84 is provided on its upper surface with, for example six positioning projections 99 for restraining a wafer W from horizontally sliding on an air layer extending on the upper surface of the face plate 84 when the wafer W is placed on the face plate 84. The six positioning projections 99 are arranged at equal angular intervals. For example, four annular heaters 101, namely, heating means for heating a wafer W, are attached concentrically to the lower surface of the face plate 84 as shown in FIG. 5. The face plate 84 is provided in its central part with a temperature sensor 12. The temperature sensor 12 responds to the temperature of the upper surface of the face plate 84 to determine the temperature of the lower surface of a wafer W placed on the face plate 84. The temperature sensor 12 is connected to a measuring unit 13. The measuring unit 13 is connected to a control unit 10 which will be described later. A signal representing the temperature of the surface of the face plate 84 is given to the control unit 10.

Figure 5:
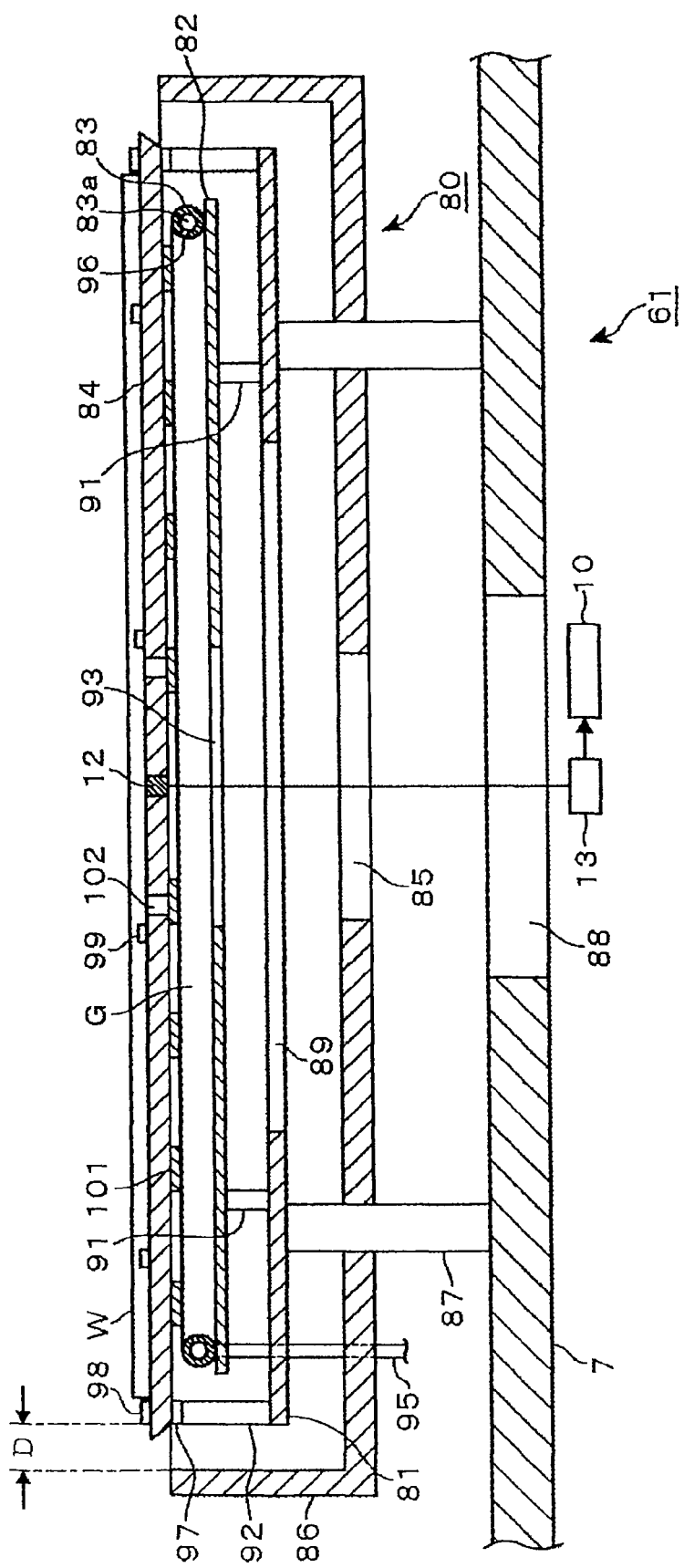
FIG. 5 is a longitudinal sectional view of the heating unit shown in FIG. 4.
Figure 6:
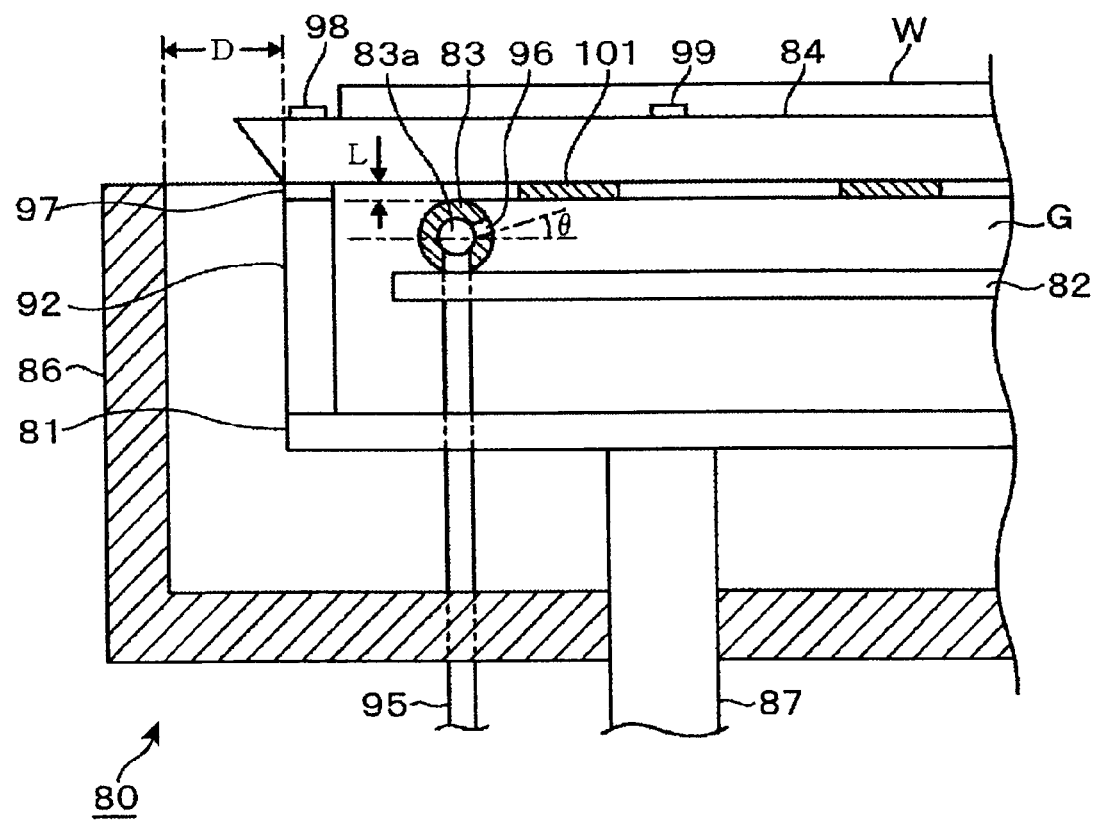
FIG. 6 is a longitudinal sectional view of the heating unit shown in FIG. 4.

Referring to FIGS. 5 and 6, the bottom plate 81, the straightening plate 82 and the temperature-reducing purge ring 83 are placed in the support ring 80, and the face plate 84 is on a plane containing the upper end of the upright circumferential wall 86 of the support ring 80. An annular opening D of, for example, 2.5 mm in width is formed between the inner circumference of the upper end of the support ring 80 and the outer circumference of the face plate 84. The annular opening D is part of the external air inlet opening. FIG. 4 shows the support ring 80 in a cutaway view to facilitate viewing the interior of the support ring 80. The face plate 84 is shown in a disk in FIG. 4. Actually, the face plate 84 is a taper plate having an upper surface of a diameter greater than that of a lower surface by, for example, about 5 mm and tapered downward. The face plate 84 is provided with small holes 102 in which the support pins 47b move vertically. The support pins 47b move vertically relative to the wall 7, the support ring 80, the bottom plate 81 and the straightening plate 82 in the gas exhaust openings 88, 85, 89 and 93 formed respectively in the wall 7, the support ring 80, the bottom plate 81 and the straightening plate 82.

As shown in FIG. 2, the heat-treating apparatus 2 is connected to the control unit 10 including for example, a computer provided with a CPU. Programs specifying a heating procedure for heating a wafer W and a cooling procedure for cooling the face plate 84 are stored in a storage device 11 installed in the control unit 10. The storage device 11 storing the programs is, for example, a hard disk, a compact disk, a magnetooptical disk or a memory card.

The operation of the heat-treating apparatus 2 will be described. The shutter, not shown, is opened, and a main carrying device 25A (or 25B) carries a wafer W having a surface coated with a liquid resist by a coating unit COT, which will be described later, through the opening 45 to a position above the cooling arm 5 in the box 41. Then, the support pins 47a transfers the wafer W from the main carrying device 45A (or 45B) to the cooling arm 5. The cooling arm 5 is moved to a processing position. Then, the lifting pins 47b disposed under the heating module 6 transfers the wafer W from the cooling arm 5 to the face plate 84 heated at a temperature suitable for heating the wafer W at a temperature of, for example, 120° C. The positioning projections 99 position the wafer W in place on the face plate 84. The face plate 84 is heated at, for example 120° C., and the bottom plate 81 is heated at a temperature near the heating temperature by heat transferred by conduction from the heaters 101 and the face plate 84.

Subsequently, the cover 62 is lowered to seal the wafer W in a heating space. Then, a predetermined gas, such as air, is supplied from the gas source 65 into the heating space and the atmosphere surrounding the wafer W is discharged through the pores 68. This condition is maintained for a predetermined time to process the wafer W by a heating process. Then, the cover 62 is raised, operations for carrying the wafer W onto the face plate 84 is reversed to transfer the wafer W to the cooling arm 5. The wafer W is held on the cooling arm 5 for a predetermined time for cooling. Then, the main carrying device 25A (or 25B) carries the wafer W out of the box 41. A predetermined number of wafers W of, for example, the same lot are processed successively by the heating process.

Description will be made of operations for processing wafers W of a succeeding lot by the heating process after all the wafers W of the preceding lot have been processed by the heating process. Suppose that a liquid resist coating the surfaces of the wafers W of the succeeding lot is to be heated at a temperature lower by 10° C. than that at which the liquid resist coating the surfaces of the wafers W of the preceding lot.

At this stage, the face plate 84 is heated at, for example, 120° C. used for heating the wafers W of the preceding lot. The temperature of the face plate 84 is lowered by the following method before starting the heating process for processing the wafers W of the succeeding lot.

The output of the heaters 101 is adjusted to heat the face plate 84 at a desired temperature for heating the wafers W of the succeeding lot. A cooling gas, such as air or nitrogen gas, is supplied from the cooling gas source 100 through the cooling gas supply line 95 at a predetermined flow rate of, for example, 120 l/min into the temperature-reducing purge ring 83. The cooling gas flows rapidly through the gas passage 83a of the temperature-reducing purge ring 83. The cooling gas is jetted through the gas jetting holes 96 circumferentially arranged in the temperature-reducing purge ring 83 into the cooling gas receiving space G toward the center of the temperature-reducing purge ring 83. Since the axes of the gas jetting holes 96 are extended obliquely upward, the cooling gas impinges on the lower surface of the face plate 84 and is guided by the straightening plate 82 so as to flow along the lower surface of the face plate 84 from a peripheral part toward the central part of the cooling gas receiving space G. Finally, the cooling gas flows down through the fourth gas exhaust opening g 93 formed in the central part of the straightening plate 82. Then, the cooling gas flows through the third gas exhaust opening 89, the second gas exhaust opening 85 and the first gas exhaust opening 88 into the lower space 4b. The cooling gas flows into the exhaust ducts 104 disposed in the lower space 4b connected to the main exhaust duct 26.

Figure 7:
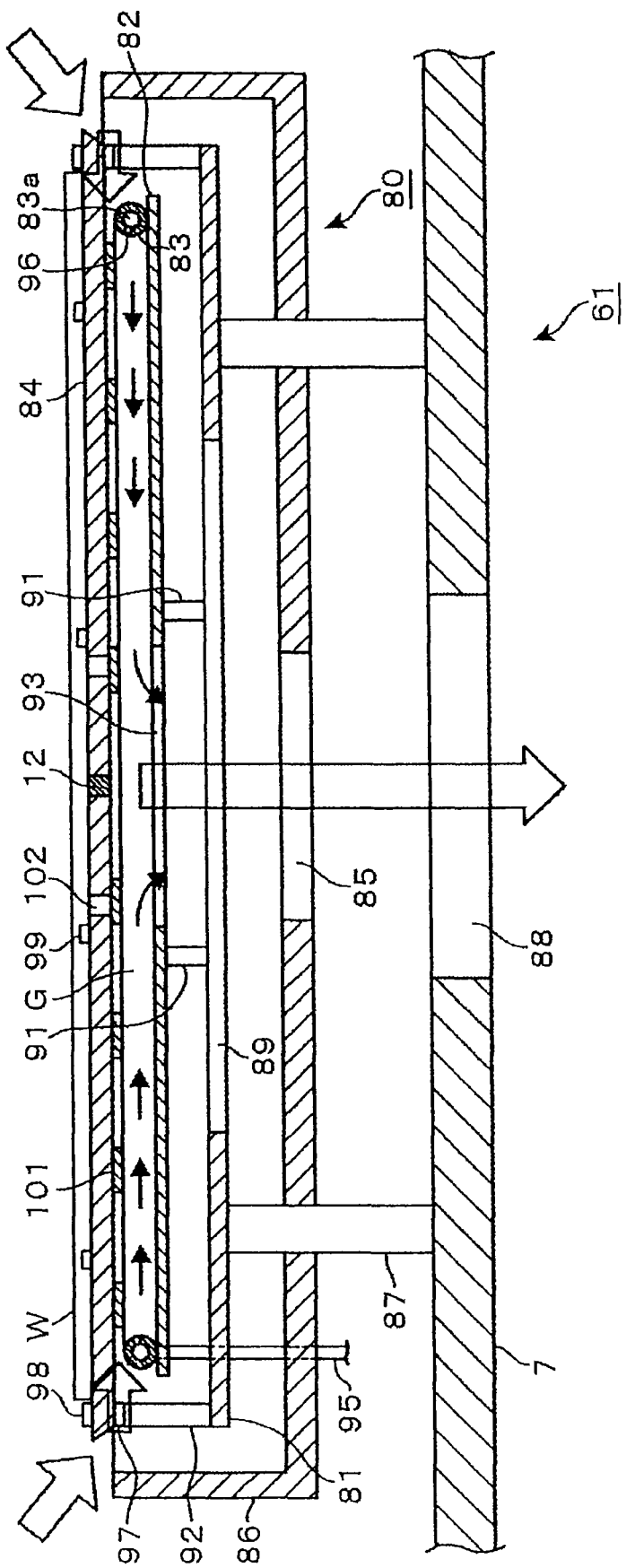
FIG. 7 is a typical sectional view showing the flow of a cooling gas in the heating unit shown in FIG. 4.
Figure 8:
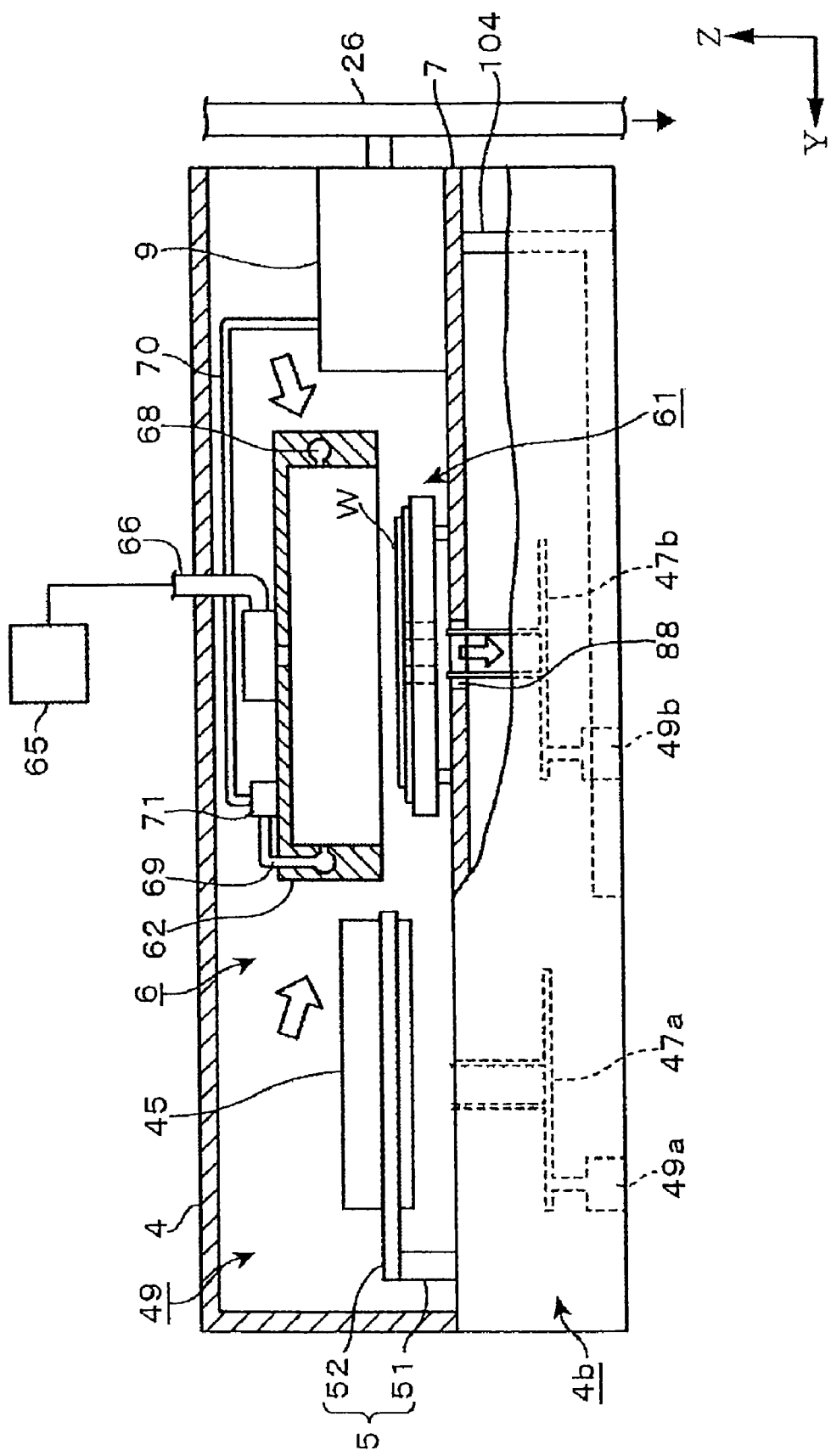
FIG. 8 is a typical sectional view showing the flow of air in the heat-treating apparatus shown in FIG. 1.

Since the annular gap L of a small thickness is formed between the face plate 84 and the temperature-reducing purge ring 83, a high vacuum is created in the gap L by an effect similar to that of an ejector or an aspirator. Consequently, the external atmosphere flows through the annular opening D between the outer circumference of the face plate 84 and the upper end of the support ring 80 at a high flow rate as high as, for example, five times the flow rate at which the cooling gas flows into the cooling gas receiving space G as shown in FIG. 7. Since the cover 62 is raised, the external atmosphere is, for example, the clean atmosphere of an ordinary temperature contained in the coating and developing system and coming from a space above the opening 45 and the housing 9 as shown in FIG. 8.

Since a large amount of the atmosphere flows together with the cooling gas into the cooling gas receiving space G, the face plate 84 and the bottom plate 81 are cooled rapidly. Since the cooling gas and the atmosphere flow from a peripheral part toward the central part of the cooling gas receiving space G, the face plate 84 can be cooled in an intrasurface uniformity. The supply of the cooling gas is stopped upon the drop of the temperature of the face plate 84 to a desired temperature for processing wafers W. Then, the wafers W of the succeeding lot are processed by a heating process similar to that by which the wafers W of the preceding lot were processed.

In this embodiment, the gap L is formed between the face plate 84 and the temperature-reducing purge ring 83, and cools the face plate 84 by jetting the cooling gas from the temperature-reducing purge ring 83 into the cooling gas receiving space G toward the central part of the cooling gas receiving space G to entrain the external atmosphere around the heating unit 61 by the cooling gas into the cooling gas receiving space G. Therefore, when the wafers W of the succeeding lot need to be processed at a temperature lower than that used for processing the wafers W of the preceding lot, the face plate 84 can be rapidly cooled by jetting the cooling gas at a low flow rate from the temperature-reducing purge ring 83. Consequently, the temperature of the face plate 84 can be reduced in a short time, which improves throughput.

The cooling gas source 100 needs a very large-scale cooling system including, for example, a compressor, to supply only the cooling gas at a flow rate equal to the sum of the respective foregoing flow rates of the cooling gas and the external air and requires much power to supply only the cooling gas at such a high flow rate. Use of the cooling gas in combination with the external air makes it possible to simplify the equipment and to reduce power consumption.

The cooling gas is supplied into the cooling gas receiving space G so as to flow from the peripheral part toward the central part of the cooling gas receiving space G by using the annular temperature-reducing purge ring 83. Thus, the cooling gas can be supplied through the single cooling gas supply line to the plural gas jetting holes 96. This face plate cooling method, as compared with a face plate cooling method using plural nozzles, needs less parts for cooling gas piping and can cool the face plate 84 in higher intrasurface uniformity.

Since the axes of the gas jetting holes 96 are inclined so as to jet the cooling gas against the lower surface of the face plate 84, the external air entrained by the cooling gas impinges on the lower surface of the face plate 84 as well. Consequently, the face plate can be rapidly cooled.

Figure 9:
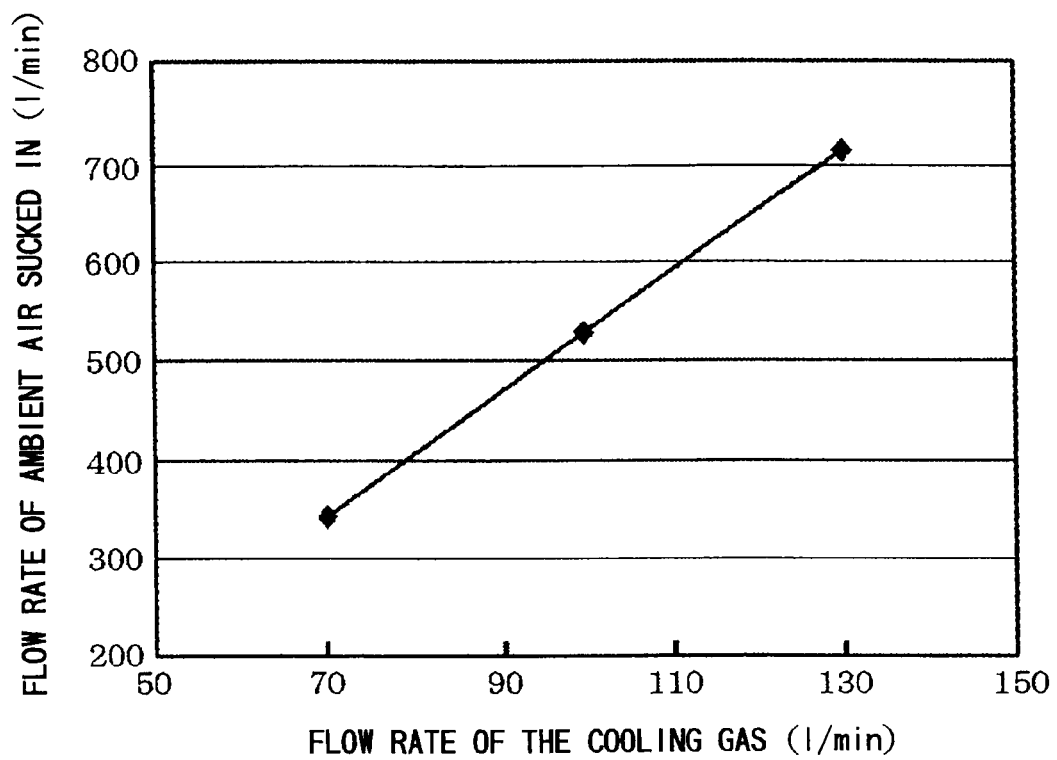
FIG. 9 is a graph showing the dependence of the flow rate of external air sucked from outside on the flow rate of the cooling gas.

Description will be made of results of analysis of the respective flow rates of the cooling gas and the external air sucked through the opening D into the cooling gas receiving space G using hot-fluid analyzing software. It was found that the flow rate of the external air entrained by the cooling gas jetted through the gas jetting holes 96 of the annular temperature-reducing purge ring 83 was five times the flow rate of the cooling gas or above as shown in FIG. 9.

Although the small holes 102 formed in the face plate 84 opens into the cooling gas receiving space G, substantially all the cooling gas jetted into the cooling gas receiving space G flows downward into the lower space 4b because the area of the fourth gas exhaust opening 93 is far greater than the sum of the areas of the open ends of the small holes 102.

According to the present invention, means for supplying the cooling gas into the cooling gas receiving space G is not limited to the annular temperature-reducing purge ring 83, but may be plural nozzles and plural supply lines as mentioned above, provided that the cooling gas can be delivered into the cooling gas receiving space G so as flow from the peripheral part toward the central part of the cooling gas receiving space G and a vacuum can be created in the gap L. The present invention can exercise a significant effect by using the face plate 84 made of a metal having a low strength and having a big thickness and a large heat capacity. The face plate 84 may be made of a material having a small heat capacity, such as aluminum nitride.

Figure 10:
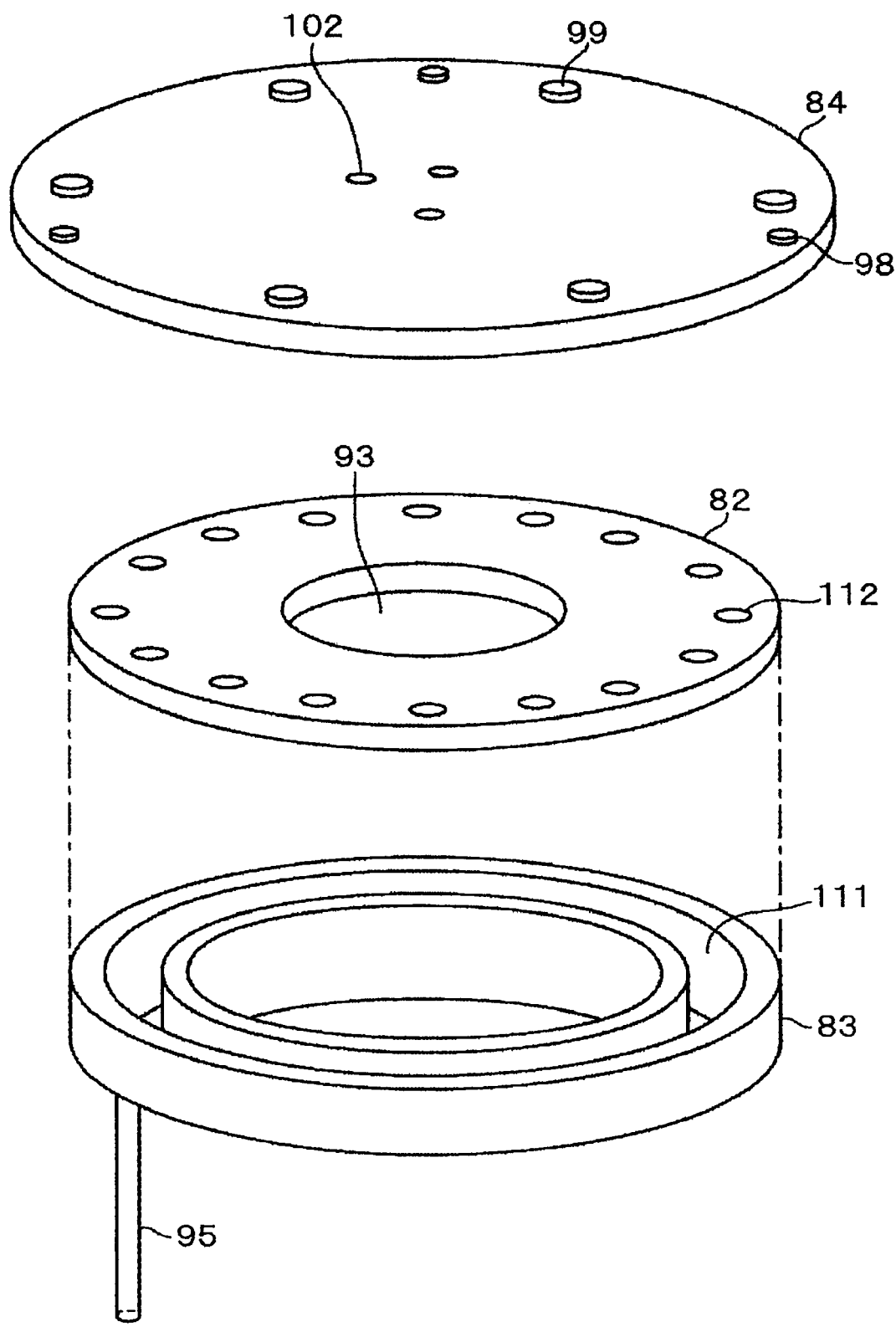
FIG. 10 is an exploded perspective view of the heating unit shown in FIG. 4.
Figure 11:
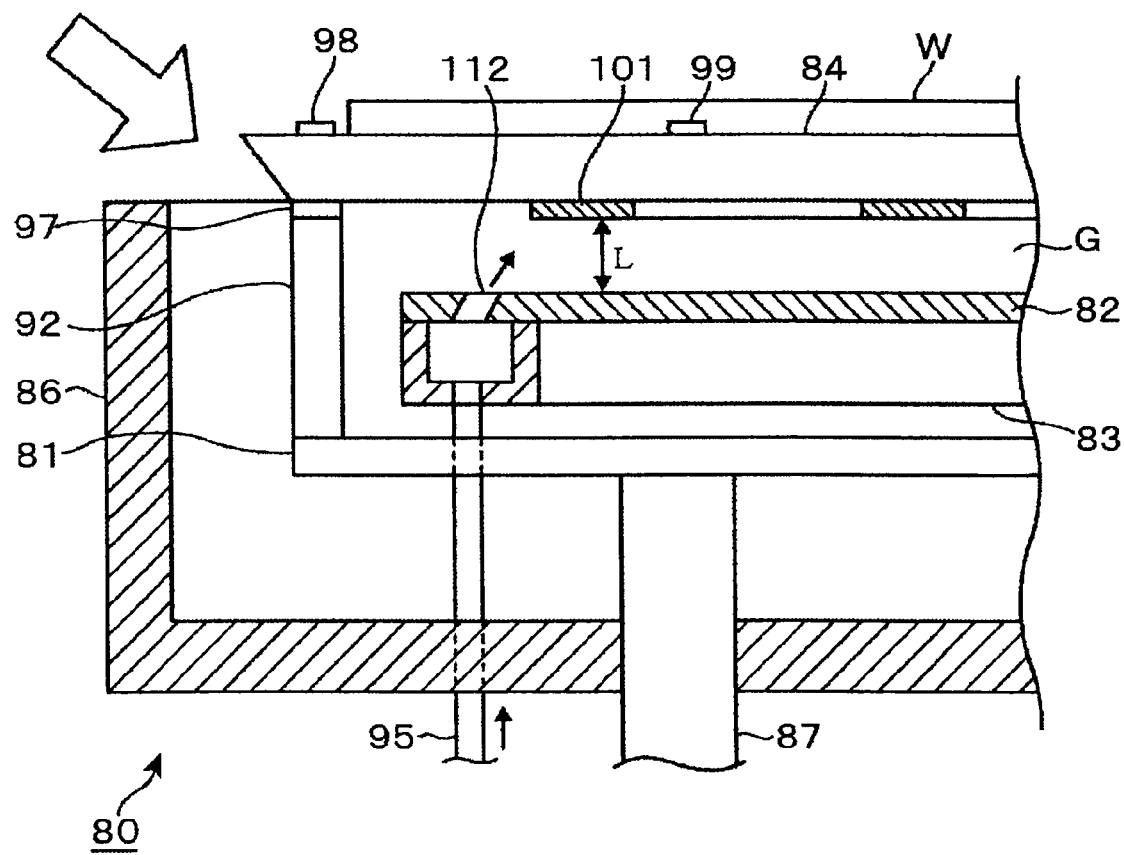
FIG. 11 is a longitudinal sectional view of the heating unit shown in FIG. 4.

A method of producing cooling gas currents flowing from the peripheral toward the central part of the cooling gas receiving space G may use, for example, a structure shown in FIGS. 10 and 11. This structure uses a temperature-reducing purge ring 83 disposed under a straightening plate 82. The temperature-reducing purge ring 83 defines an annular groove 111 having a U-shaped cross section and an open, horizontal upper end. The straightening plate 82 is brought into close contact with the upper end of the temperature-reducing purge ring 83 and a sealing member is held between the upper end of the temperature-reducing purge ring 83 and the straightening plate 82. Plural cooling gas jetting holes 112 are formed in a peripheral part of the straightening plate 82 so as to open into the annular groove 111. As shown in FIG. 11, the axes of the cooling gas jetting holes 112 are inclined obliquely upward so as to jet the cooling gas radially inward. The cooling gas supply line 96 is connected to an inlet formed in the bottom wall of the temperature-reducing purge ring 83. The distance between the lower surface of the temperature-reducing purge ring 83 and the upper surface of the straightening plate 82 corresponds to the thickness of the foregoing gap L. The distance corresponding to the thickness of the gap L is, for example, 3 mm.

The cooling gas supplied from the cooling gas source 100 through the cooling gas supply line 95 into the temperature-reducing purge ring 83 flows rapidly in a circumferential direction. The cooling gas is jetted through the cooling gas jetting holes 112 into the cooling gas receiving space G. Since the axes of the gas jetting holes 112 are extended obliquely upward, the cooling gas flows from a peripheral part toward the central part of the cooling gas receiving space G. Consequently, a high vacuum is created in the gap L, the external atmosphere is sucked into the cooling gas receiving space G as mentioned above. The effect of this structure is the same as the first embodiment. In FIGS. 10 and 11, parts like or corresponding to those of the first embodiment are designated by the same reference characters.

Figure 14:
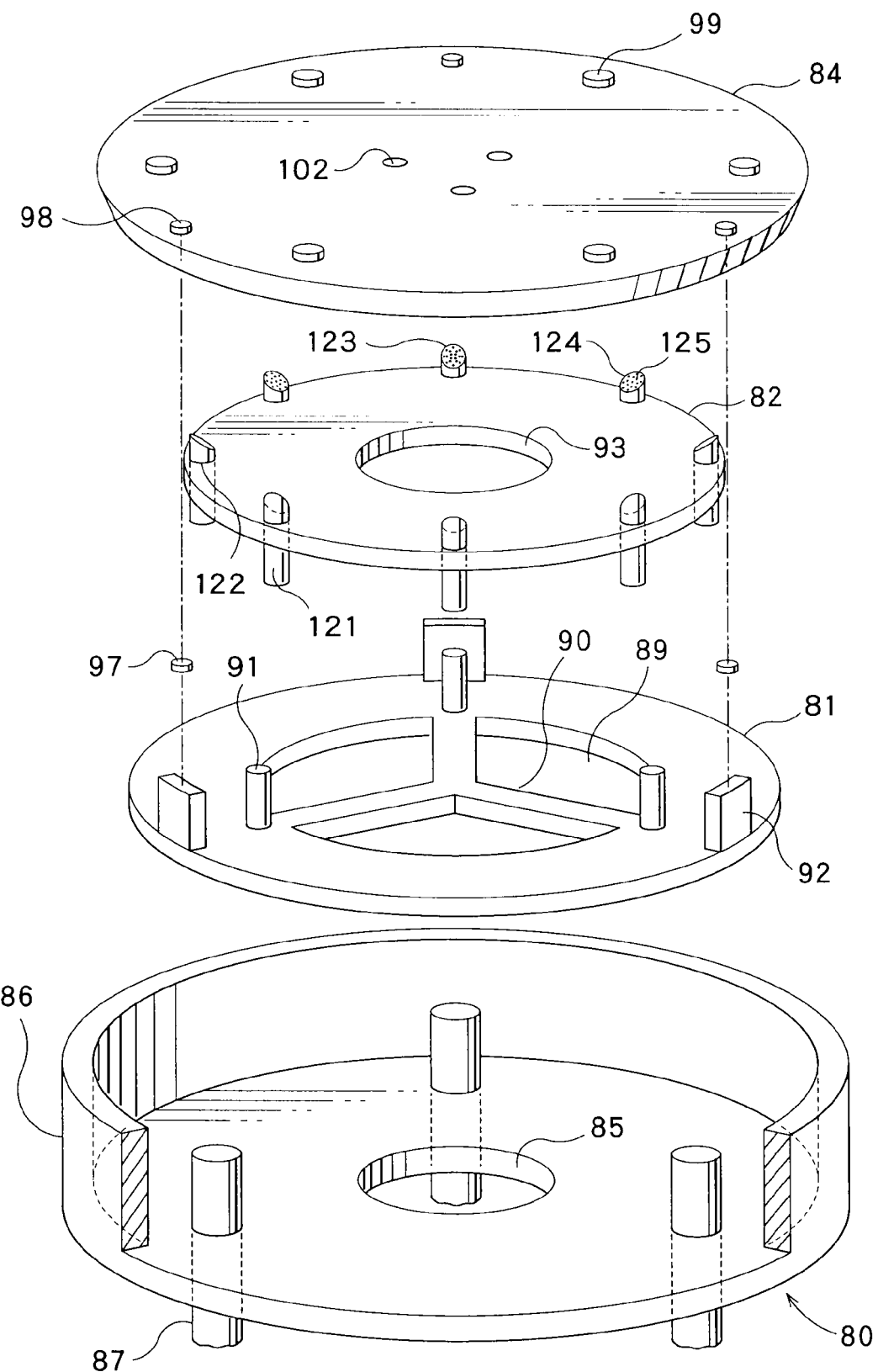
FIG. 14 is an exploded perspective view of the heating unit shown in FIG. 4.

A heat-treating apparatus in a second embodiment according to the present invention will be described with reference to FIGS. 14 and 15. Plural cooling nozzles 121, for example, eight cooling nozzles 121, are set upright on the upper surface of a bottom plate 81 at equal angular intervals. A straightening plate 82 is provided with eight through holes 122 at positions respectively corresponding to the eight cooling nozzles 121. The cooling nozzles 121 are inserted in the through holes 122 and upper parts of the cooling nozzles 121 projects upward from the upper surface of the straightening plate 82. The upper ends 123 of the cooling nozzles 121 have beveled upper end surfaces 124 extending obliquely upward and facing the center of the straightening plate 82. For example, the beveled upper end surfaces 124 are inclined at an angle θ in the range of, for example, 20° to 35° to a horizontal plane. Each of the beveled upper end surfaces 124 is provided with plural gas jetting holes 125.

Figure 15:
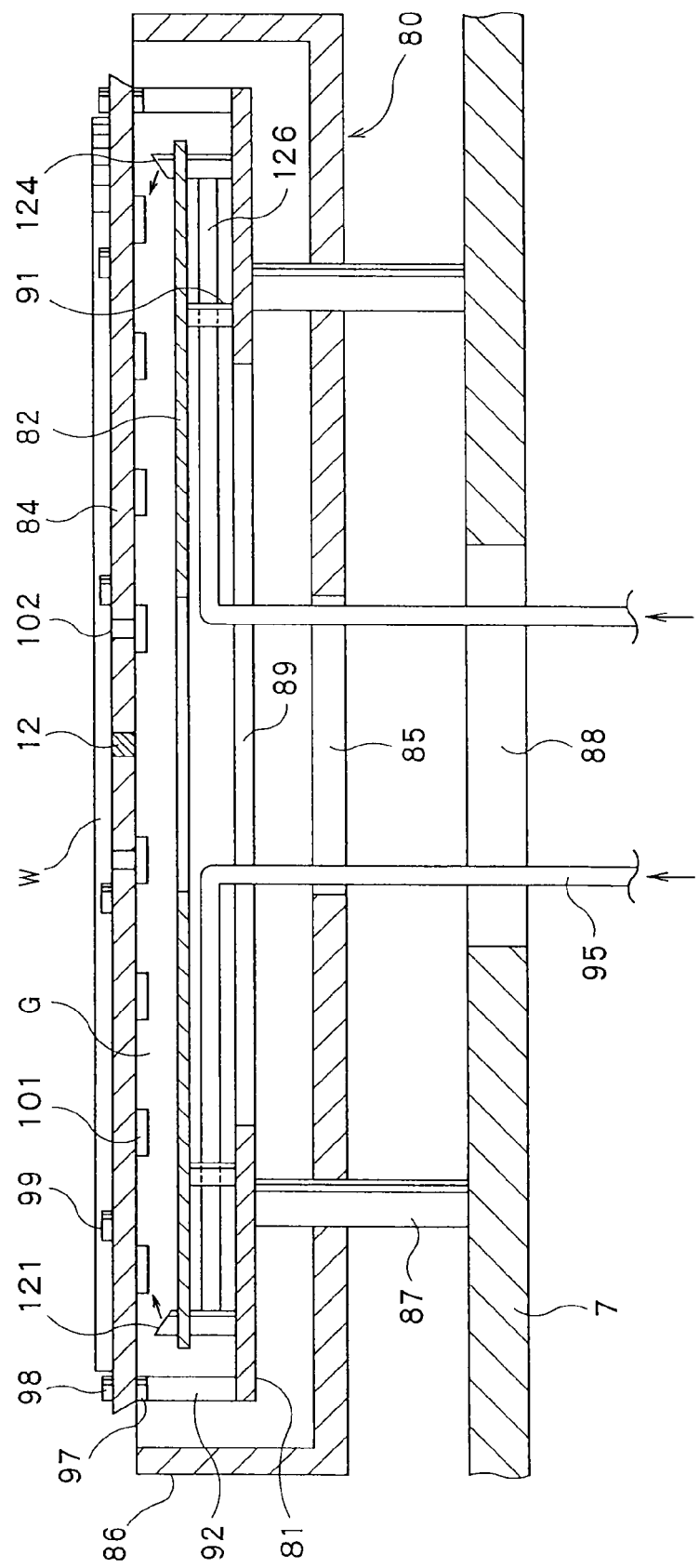
FIG. 15 is a longitudinal sectional view of the heating unit shown in FIG. 4.

As shown in FIG. 15, each of cooling gas supply pipes 126 forming a cooling gas supply passages has one end connected detachably by a connector, not shown, to a part of each of the cooling nozzles 121 extending under the straightening plate 82. The cooling gas supply pipes 126 are bent so as to extend downward through a third gas exhaust opening 89, a second gas exhaust opening 85 and a first gas exhaust opening 88. The other end of each cooling gas supply pipe 126 is connected to a cooling gas source 100. The eight cooling nozzles 121 arranged at equal angular intervals will not obstruct the flow of the external air into a cooling gas receiving space G like the temperature-reducing purge ring 83 does. Thus, the amount of the external air that can flow into the cooling gas receiving space G can be increased. In FIGS. 14 and 15, parts like or corresponding to those of the first embodiment are designated by the same reference characters.

The operation and effect of heat-treating apparatus in the second embodiment will be described. A cooling gas is supplied through the cooling gas supply pipes 126 forming cooling gas passages to the cooling nozzles 121. The cooling gas jetted obliquely upward through the gas jetting holes 125 flows into the cooling gas receiving space G. The cooling gas flows radially inward from eight positions in a peripheral part of the cooling gas receiving space G toward a central part of the cooling gas receiving space G. Thus, a vacuum is created in the gap L and the external air is sucked through the gap L into the cooling gas receiving space G. Consequently, a heating plate is cooled rapidly like the face plate 84 of the first embodiment is cooled. Since the eight cooling nozzles 121 arranged at equal angular intervals on the straightening plate 82 are used for jetting the cooling gas, the cooling nozzles 121, unlike the temperature-reducing purge ring 83, scarcely obstruct the suction of the external air into the cooling gas receiving space G, the amount of the external air that can flow into the cooling gas receiving space G can be increased and the heating plate can be cooled at higher cooling efficiency. The number of the cooling nozzles is not limited to eight. It goes without saying that the cooling nozzles 121 may be placed on the outer circumference of the straightening plate 82 so that the upper parts thereof project upward from the upper surface of the straightening plate 82.

Figure 12:
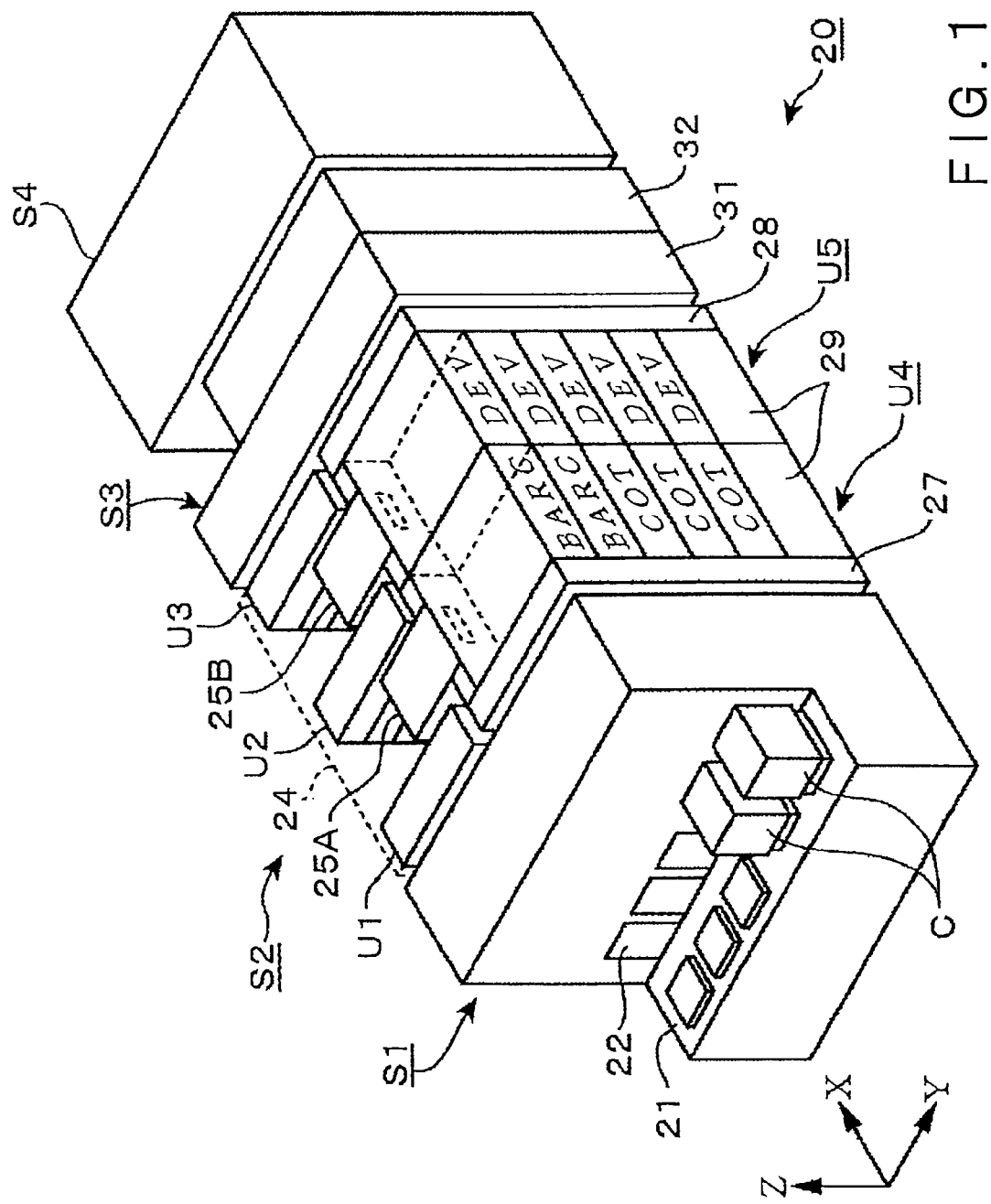
FIG. 12 is a perspective view of a coating and developing system including the heat-treating apparatus shown in FIG. 1.
Figure 13:
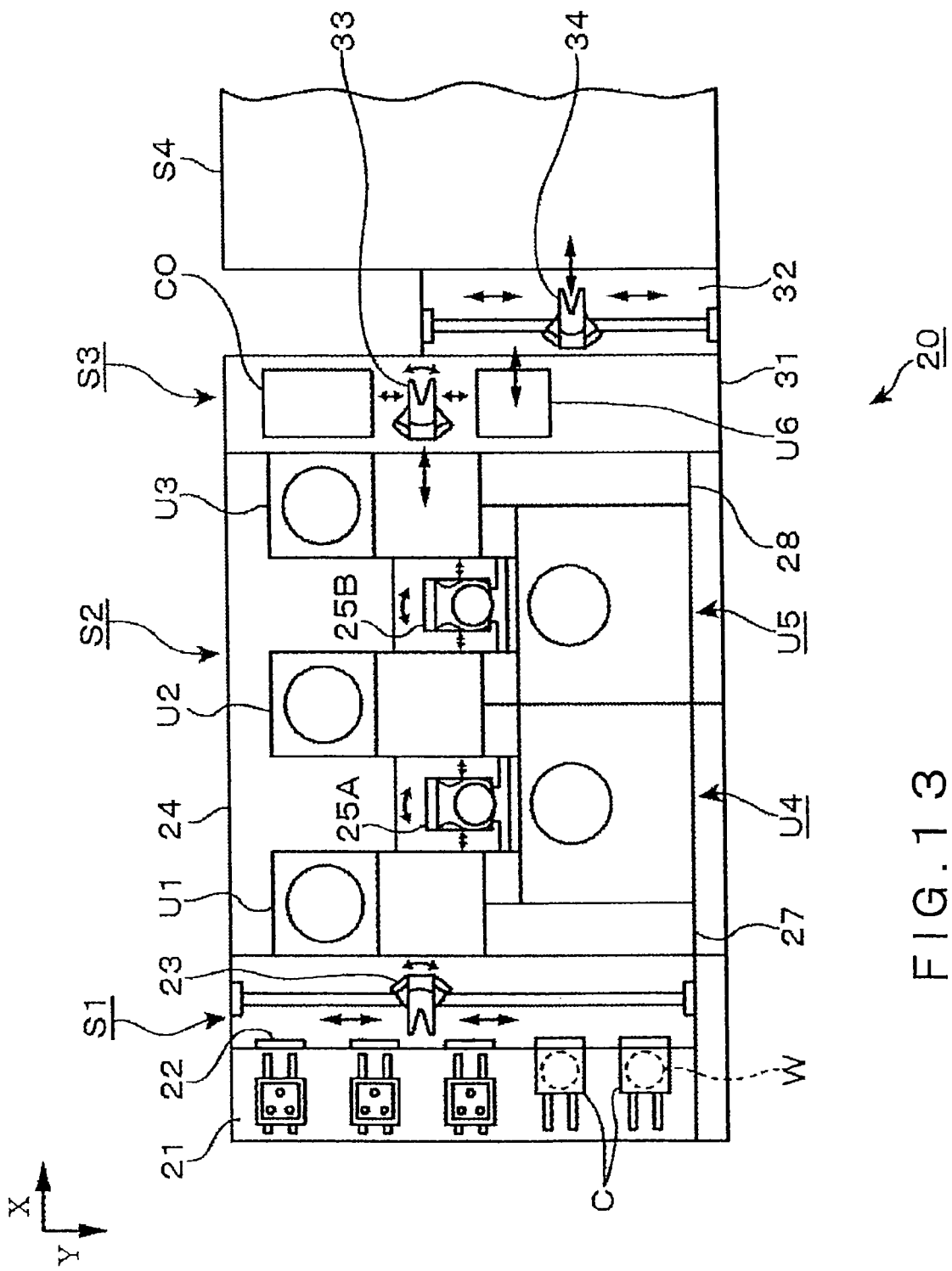
FIG. 13 is a plan view of the coating and developing system shown in FIG. 12

Description will be made of a coating and developing system to which the heat-treating apparatus 2 is applied. Referring to FIGS. 12 and 13, the coating and developing system has a cassette handling block S1, for receiving and sending out substrate cassettes C each containing, for example, thirteen wafers W. The cassette handling block S1 is provided with carrier tables 21 on which substrate cassettes C are supported, a wall disposed behind the carrier tables 21 (on the side of the X-direction) and provided with closable transfer openings 22, and a transfer device 23 for taking out the wafers W from the substrate cassette C through the transfer opening 22. A processing block S2 surrounded by a box 24 is disposed behind and joined to the cassette handling lock S1. In the processing block S2, shelf units U1, U2 and U3 each formed by stacking up heating and cooling units each including the heat-treating apparatus 2 in layers, main carrying devices 25A and 25B for carrying wafers W from and to processing units each including a coating and developing unit, which will be described later, are arranged alternately. Thus, the shelf units U1, U2 and U3 and the main carrying devices 25A and 25B are arranged longitudinally in the X-direction in a row. Openings through which a wafer W is received and sent out are formed in the side walls of the shelf units U1, U2 and U3 acing the main carrying devices 25A and 25B. Thus, wafers W can be optionally moved from the shelf unit U1 to the shelf unit &3 in the processing block S2.

The main carrying devices 25A and 25B are disposed in a space defined by the opposite side walls of the shelf units U1 and U2, the opposite side walls of the shelf units U2 and U3, the inner end surfaces of wet processing units U4 and U5 on the right-hand side (on the positive side of the Y-axis) of the row of the shelf units U1, U2 and U3 and the back wall of the box 24. Temperature-and-humidity regulating units 27 and 28 each including a temperature regulating device for regulating the temperature of a processing liquid and ducts for temperature-and-humidity regulation are disposed contiguously to the side walls of the wet processing units U4 and U5, respectively. The processing units U4 and U5 are mounted on a storage unit 29 having spaces for storing chemical solutions, such as a coating solution (a liquid resist) and a developer. The wet processing unit U4 is formed by stacking up coating units COT and antireflection film forming units BARC in, for example, five layers. The processing unit U5 is formed by stacking up developing layers DEV in, for example, five layers. Each of the shelf units U1, U2 and U3 is formed by stacking up processing devices for carrying out pretreatment processes and posttreatment processes before and after the processes carried out by the wet processing units U4 and U5 in, for example, ten layers. An interface block S3 including a first carrying chamber 31 and a second carrying chamber 32 is disposed behind the shelf unit U3 of the processing block S2, and an exposure system S4 is connected to the interface block S3. The interface block S3 is internally provided with two transfer devices 33 and 34 for transferring a wafer W between the processing block S2 and the exposure system S4, s shelf unit U6 and a buffer cassette CO.

Flow of a wafer W in the coating and developing system will be described by way of example. A substrate cassette C containing wafers W delivered from an external device is placed on the carrier table 21, the lid of the substrate cassette C is opened, the transfer opening 22 is opened, and the transfer device 23 takes out a wafer W from the substrate cassette C. The wafer W is transferred through a transfer unit, which is one of units of the shelf unit U1, to the main carrying device 25A. Then, the wafer W is subjected to pretreatment processes to be carried out prior to a coating process, such as a hydrophobicity imparting process and a cooling process, by some of the shelves of the shelf units U1 to U3. Then, the wafer W is subjected to a coating process to coat a surface of the wafer W with a liquid resist by the coating unit COT. The wafer W coated with the liquid resist is heated and cooled by some heat-treating apparatus 2 included in the shelf units U1 to U3. Then, the wafer W is carried through a transfer unit of the shelf unit U3 to the interface block S3. In the interface block S3, the wafer W is transferred, for example, from the transfer device 33 through the shelf unit U6 and the transfer device 34 to the exposure system S4. The wafer W is subjected to an exposure process by the exposure system S4. The operation for transferring the wafer W to the exposure system S4 is reversed to carry the wafer W processed by the exposure process to the main carrying device 25A. Then, the wafer W is subjected to a developing process by the developing unit DEV to form a resist mask, and then the wafer W is returned to the substrate cassette C placed on the carrier table 21.

What is claimed is:

1. A heat-treating apparatus for heat-treating a substrate, said heat-treating apparatus comprising:
    a heating plate capable of supporting a substrate thereon and provided with a heating member;
    a cooling gas jetting member provided with plural gas jetting holes arranged along the circumference of the heating plate to jet a cooling gas for cooling the heating plate so that the cooling gas flows from the circumference toward the center of the lower surface of the heating plate;
    a straightening plate disposed opposite to the heating plate under the heating plate close to the heating plate to straighten the flow of the cooling gas under the heating plate, and provided with an exhaust opening in a central part thereof; and
    a member surrounding the gas jetting member and the straightening plate so as to define an air suction space through which an atmosphere external to the heat treating apparatus is sucked into a space between the heating plate and the straightening plate by the vacuum created by the flow of the cooling gas.

2. The heat-treating apparatus according to claim 1, wherein the cooling gas jetting member provided with the gas jetting holes is an annular pipe formed in a ring and disposed under the circumference of the heating plate, a cooling gas supply line is connected to the annular pipe, and the gas jetting holes are formed in the inner circumference of the annular pipe.

3. The heat-treating apparatus according to claim 2, wherein the annular pipe is separated from the lower surface of the heating plate by a space connecting to the air suction space.

4. The heat-treating apparatus according to claim 1, wherein the cooling gas jetting member includes plural cooling nozzles disposed with their tips arranged at angular intervals along the circumference of the heating plate under the heating plate, and the gas jetting holes are formed in the tips of the cooling nozzles.

5. The heat-treating apparatus according to claim 4, wherein the cooling nozzles penetrate the straightening plate from a lower surface toward an upper surface of the straightening plate.

6. The heat-treating apparatus according to claim 1, wherein axes of the gas jetting holes extend such that the cooling gas jetted through the gas jetting holes impinges on the lower surface of the heating plate.

7. A heat-treating method of heat-treating a substrate, said heat-treating method comprising the steps of:
heating a substrate placed on a heating plate;
creating a vacuum in a space under a peripheral part of the lower surface of the heating plate by jetting a cooling gas for cooling the heating plate through plural gas jetting holes arranged along the circumference of the heating plate so that the cooling gas flows from a circumferential part toward a central part of the heating plate;
cooling the heating plate by the cooling gas and air sucked through an air suction space around the heating plate by a vacuum created by the flow of the cooling gas into a space between the heating plate and a straightening plate disposed under the heating plate; and
discharging the cooling gas and the air sucked from a space external to the space between the heating plate and the straightening plate and into the space between the heating plate and the straightening plate downward through a gas exhaust opening formed in a central part of the straightening plate.

8. The heat-treating apparatus according to claim 7, wherein the cooling gas is jetted obliquely upward such that the cooling gas impinges on the lower surface of the heating plate in the step of creating a vacuum.

9. A storage medium storing a computer program including a set of instructions for a computer to execute to carry out the heat-treating method according to claim 7.

* * * * *